US012732163B2

(12) United States Patent
Savary et al.

(10) Patent No.: US 12,732,163 B2
(45) Date of Patent: Sep. 8, 2026

(54) TUNABLE ATTENUATOR

(71) Applicant: NXP B.V., Eindhoven (NL)

(72) Inventors: Pierre Pascal Savary, Leguevin (FR); Mohamad El Ozeir, Toulouse (FR); Stephane Damien Thuriés, Saubens (FR)

(73) Assignee: NXP B.V., Eindhoven (NL)

( * ) Notice: Subject to any disclaimer, the term of this patent is extended or adjusted under 35 U.S.C. 154(b) by 529 days.

(21) Appl. No.: 18/366,917

(22) Filed: Aug. 8, 2023

(65) Prior Publication Data

US 2024/0056057 A1 Feb. 15, 2024

(30) Foreign Application Priority Data

Aug. 11, 2022 (EP) .................................... 22306217

(51) Int. Cl.
*H03F 9/00* (2006.01)
*H03F 3/193* (2006.01)
*H03H 11/24* (2006.01)

(52) U.S. Cl.
CPC ........... *H03H 11/245* (2013.01); *H03F 3/193* (2013.01); *H03F 2200/451* (2013.01)

(58) Field of Classification Search
CPC ... H03F 9/00; H03F 3/191; H03F 1/22; H03F 3/42
USPC ........................................ 330/284, 276, 165
See application file for complete search history.

(56) References Cited

U.S. PATENT DOCUMENTS 3,359,511 A 12/1967 Varnell, Jr.
3,495,193 A * 2/1970 Harwood ............ H03G 3/3052 455/249.1
3,631,333 A 12/1971 Pichal
8,386,986 B2 2/2013 Granger-Jones et al.
9,780,755 B1 * 10/2017 Omid-Zohoor ......... H01F 27/29
9,935,614 B2 4/2018 Shrivastava

FOREIGN PATENT DOCUMENTS

JP S562633 U 1/1981

OTHER PUBLICATIONS

Agarwal, P., "25.3 GHz, 4.1 m W veo with 34.8% Tuning Range Using a Switched Substrate-Shield Inductor", 2015 IEEE MTT-S International Microwave Symposium, May 17-22, 2015.
Francois, B., "A Fully Integrated Transformer-Coupled Power Detector With 5 GHz RF PA for WLAN 802.11ac in 40 nm CMOS", IEEE Journal of Solid-State Circuits, vol. 50, No. 5, May 2015.
Trask, C., "A wide-band low-distortion ferrimagnetic attenuator", 1998 IEEE MTT-S International Microwave Symposium Digest, Jun. 7-12, 1998.

* cited by examiner

*Primary Examiner* — Henry Choe

(57) ABSTRACT

In accordance with a first aspect of the present disclosure, a tunable attenuator is provided, comprising: one or more transformer windings configured to facilitate attenuating a signal; one or more conductive loops provided underneath the transforming windings; a controller configured to control an amount of current flowing through the conductive loops, thereby providing a tunable attenuation of said signal. In accordance with a second aspect of the present disclosure, a corresponding method of producing a tunable attenuator is conceived.

20 Claims, 8 Drawing Sheets

TUNABLE ATTENUATOR

CROSS-REFERENCE TO RELATED APPLICATIONS

This application claims the priority under 35 U.S.C. § 119 of European Patent application no. 22306217.5, filed on 11 Aug. 2022, the contents of which are incorporated by reference herein.

TECHNICAL FIELD

The present disclosure relates to a tunable attenuator. Furthermore, the present disclosure relates to a method of producing a tunable attenuator.

BACKGROUND

Attenuators can be used in radar transceivers for several purposes, such as gain compensation or isolation. For example, in the transmitter sub-system of a radar transceiver several attenuators at interstages may be added for temperature compensation of the gain, avoiding reliability issues and facilitating output power calibration.

SUMMARY

In accordance with a first aspect of the present disclosure, a tunable attenuator is provided, comprising: one or more transformer windings configured to facilitate attenuating a signal; one or more conductive loops provided underneath the transforming windings; a controller configured to control an amount of current flowing through the conductive loops, thereby providing a tunable attenuation of said signal.

In one or more embodiments, the tunable attenuator further comprises a shield interposed between the transformer windings and the conductive loops.

In one or more embodiments, the conductive loops comprise one or more apertures for accommodating a controllable element, and the controller is configured to control the amount of current flowing through the conductive loops via said controllable element.

In one or more embodiments, the controllable element is a controllable switch.

In one or more embodiments, the controllable switch is a metal oxide semiconductor (MOS) switch.

In one or more embodiments, the controller comprises a voltage control circuit which is operatively coupled to a gate of the MOS switch.

In one or more embodiments, the controller is configured to control the amount of current flowing through the conductive loops in dependence on a measured temperature.

In one or more embodiments, an amplifier stage, in particular an amplifier stage for use in a radar transceiver, comprises a tunable attenuator of the kind set forth.

In one or more embodiments, a radar transceiver, in particular a millimeter-wave (mmw) radar transceiver, comprises a tunable attenuator of the kind set forth.

In accordance with a second aspect of the present disclosure, a method of producing a tunable attenuator is conceived, the method comprising providing the attenuator with: one or more transformer windings configured to facilitate attenuating a signal; one or more conductive loops provided underneath the transforming windings; a controller configured to control an amount of current flowing through the conductive loops, thereby providing a tunable attenuation of said signal.

In one or more embodiments, the method further comprises providing the attenuator with a shield interposed between the transformer windings and the conductive loops.

In one or more embodiments, the conductive loops comprise one or more apertures for accommodating a controllable element, wherein the controller is configured to control the amount of current flowing through the conductive loops via said controllable element.

In one or more embodiments, the controllable element is a controllable switch.

In one or more embodiments, the controllable switch is a metal oxide semiconductor (MOS) switch.

In one or more embodiments, the method further comprises providing the controller with a voltage control circuit which is operatively coupled to a gate of the MOS switch.

DESCRIPTION OF DRAWINGS

Embodiments will be described in more detail with reference to the appended drawings.

DESCRIPTION OF EMBODIMENTS

As mentioned above, attenuators can be used in radar transceivers for several purposes, such as gain compensation or isolation. For example, in the transmitter sub-system of a radar transceiver several attenuators at interstages may be added for temperature compensation of the gain, avoiding reliability issues and facilitating output power calibration.

Figure 1A:
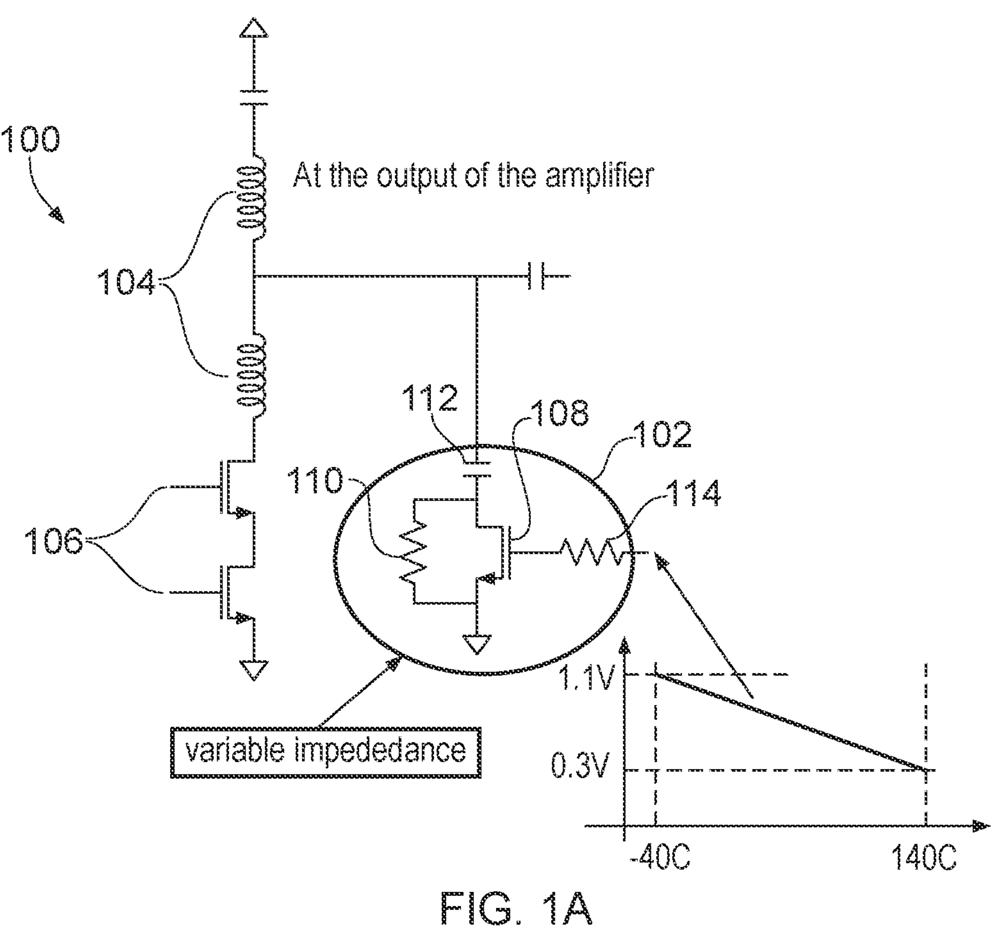
FIG. 1A shows an example of an amplifier with an attenuator used to compensate the gain over temperature.

FIG. 1A shows an example of an amplifier 100 with an attenuator 102 used to compensate the gain over temperature. The amplifier 100 comprises a plurality of inductors 104 and metal oxide semiconductor (MOS) transistors 106 operatively coupled to the attenuator 102, which includes a variable impedance. The attenuator 102 is coupled to the output of the amplifier 100. The amplifier 100 may for example be included in a transceiver, more specifically in a radar transceiver. The attenuator 102 is composed of a MOS transistor 108 behaving as a variable resistor, as its drain-source voltage (VDS) is forced to 0 by the resistor 110 connected between its drain and source, a bypass capacitor 112 isolating the MOS transistor 108 from the amplifier supply, and a resistor 114 isolating the gate of the MOS transistor 108 from the control voltage circuit. The attenuator 102 enables maintaining a flat gain over temperature by applying a variable voltage dependent on the temperature to the gate of the MOS transistor 108, which therefore behaves as a variable resistor also dependent on the temperature. This, in turn, ensures a reliable operation of the transceiver in which the attenuator 102 is integrated.

Figure 1B:
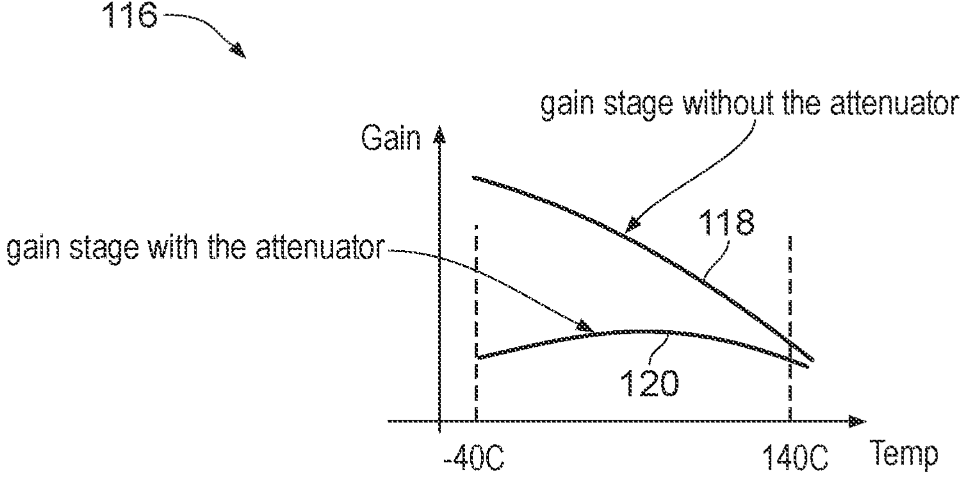
FIG. 1B shows a diagram of the amplifier gain versus temperature.

FIG. 1B shows a diagram 116 of the amplifier gain versus temperature. In particular, a first line 118 shows the output of a gain stage which does not use the attenuator 102 shown in FIG. 1A, while a second line 120 shows the output of a gain stage which uses the attenuator 102. The attenuator 102 has the drawback of degrading the uncorrelated noise when attenuating, because the attenuation is typically performed by a MOS channel, adding 1/f noise around the carrier signal. In other words, the uncorrelated noise increases when attenuating, which means that the signal-to-noise ratio (SNR) decreases.

Now a tunable attenuator and a corresponding method of producing a tunable attenuator will be described, which facilitate avoiding a degradation of the uncorrelated noise, without significantly increasing the amount of hardware resources.

In accordance with a first aspect of the present disclosure, a tunable attenuator is provided, comprising: one or more transformer windings configured to facilitate attenuating a signal; one or more conductive loops provided underneath the transforming windings; a controller configured to control an amount of current flowing through the conductive loops, thereby providing a tunable attenuation of said signal. By providing conductive loops underneath the transformer windings and controlling the amount of current flowing through the conductive loops, a tunable attenuation may be achieved which has a smaller impact on the uncorrelated noise, at a relatively small or negligible cost in terms of hardware resources. In particular, since a transformer typically already forms part of an amplifier, no additional hardware resources are needed if the attenuator is implemented in the amplifier.

In one or more embodiments, the tunable attenuator further comprises a shield interposed between the transformer windings and the conductive loops. The shield permits only the magnetic field to pass through. In particular, the shield may form part of the transformer and isolate the windings from a substrate by blocking the electric field, thereby avoiding parasitic capacitances between the windings and the substrate. Since the substrate is resistive, it would add losses to the transformer if the shield would not be present. However, the shield does not block the magnetic field, so it would not change—or change only marginally—the attenuation due to the current loop if not present. Accordingly, the shield may be used to optimize the transformer performance when there is no attenuation, i.e., when the current loop is opened.

In one or more embodiments, the conductive loops comprise one or more apertures for accommodating a controllable element, and the controller is configured to control the amount of current flowing through the conductive loops via said controllable element. This facilitates controlling the amount of current flowing through the conductive loops. In one or more embodiments, the controllable element is a controllable switch. This further facilitates controlling the amount of current flowing through the conductive loops. In a practical implementation, the controllable switch is a MOS switch. In a further practical implementation, the controller comprises a voltage control circuit which is operatively coupled to a gate of the MOS switch. The skilled person will appreciate that other types of controllable elements may equally be used. Generally speaking, any device that behaves as a variable resistor with a small parasitic capacitance, either in parallel with the resistor or with the substrate, may be a suitable controllable element.

In one or more embodiments, the controller is configured to control the amount of current flowing through the conductive loops in dependence on a measured temperature. This allows controlling the attenuation in dependence on the temperature, which may be useful in various applications. Furthermore, the tunable attenuator may be used to advantage in an amplifier stage, in particular an amplifier stage for use in a radar transceiver. Thus, a radar transceiver, in particular a millimeter-wave, mmw, radar transceiver, may comprising a tunable attenuator of the kind set forth.

The presently disclosed tunable attenuator may use the sensitivity of a transformer to the magnetic coupling and current losses in metal loops, which is typically seen as a drawback, to advantage. More specifically, a current loop may be created underneath the transformer windings, below the shield, and the loop may be controlled by at least one MOS switch allowing more or less current in the loop, thereby creating a tunable attenuation. It is noted that the attenuation level may depend on the size of the conductive loop and the size of the MOS switch. The presently disclosed tunable attenuator has a reduced impact on the uncorrelated noise, because the attenuation is effected by mmw current losses in the loop, and not by a MOS transistor behaving as a variable resistor as explained with reference to FIG. 1A. In other words, the aforementioned 1/f noise is not seen. Another advantage is the compactness: as in mmw interstage matchings transformers are typically already used, no extra layout area is needed (e.g., any added MOS switches may be very small compared to the transformer size).

In accordance with the present disclosure, a transformer may be provided with a metal loop under a shield through which only the magnetic field passes. Furthermore, the metal loop may be closed by a MOS channel. Accordingly, losses in the transformer with the current loop may be created on purpose. Furthermore, the MOS channel may be controlled on the gate to tune the channel resistance, allowing more or less mmw current flowing through the metal loop. More specifically, the amount of mmw current flowing through the metal loop determines the level of attenuation. In a practical implementation, a voltage control circuit may be coupled to the gate to control the attenuation, for example in dependence on the temperature.

Figure 2A:
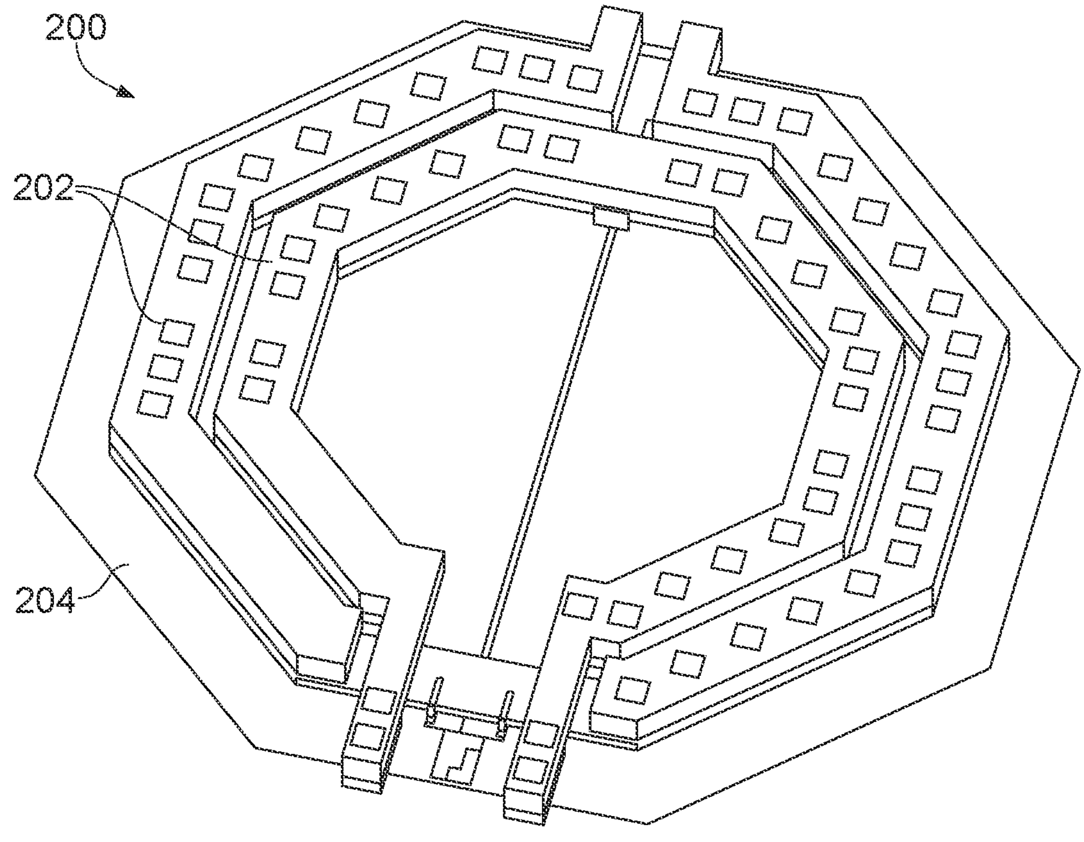
FIG. 2A shows an illustrative embodiment of a transformer arrangement in a top view.
Figure 2B:
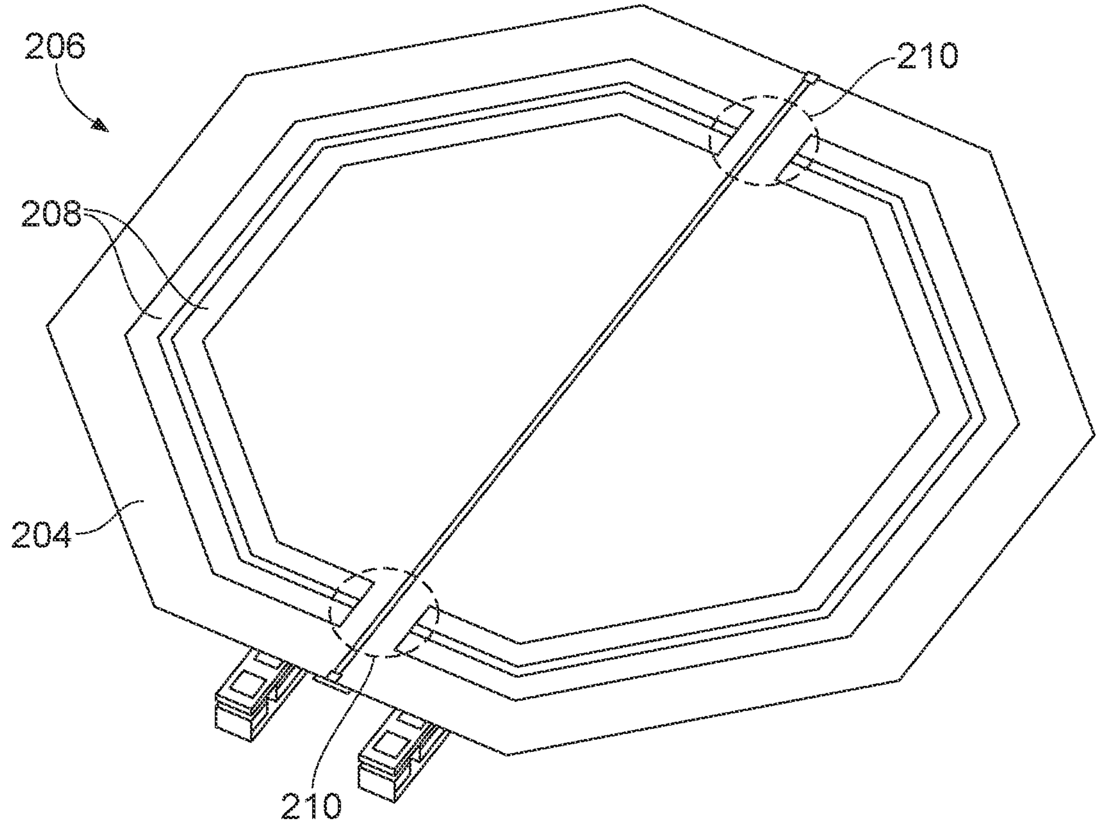
FIG. 2B shows an illustrative embodiment of the transformer arrangement in a bottom view.

FIGS. 2A and 2B show an illustrative embodiment of a transformer arrangement 200, 206 in a top view and in a bottom view, respectively. The transformer arrangement 200, 206 may form part of the presently disclosed tunable attenuator. The transformer arrangement 200, 206 comprises transformer windings 202 which have been mounted on a shield 204. In addition, the transformer arrangement 200, 206 comprises conductive loops 208 provided underneath the transformer windings 202, more specifically on the other side of the shield 204. Accordingly, the shield 204 is interposed between the transformer windings 202 and the conductive loops 208. Furthermore, the conductive loops 208 comprise apertures 210 for accommodating controllable elements, such as MOS switches (not shown). Thus, the current loop formed by the conductive loops 208 may be cut on both sides to have negligible losses in the “no losses” state. It is noted that the “no losses” state refers to a state in which there is no voltage on the MOS switches, i.e., when no attenuation should be performed. In this state, the transformer performance should be similar to the performance of a transformer that does not have the current loop underneath the windings.

Figure 3:
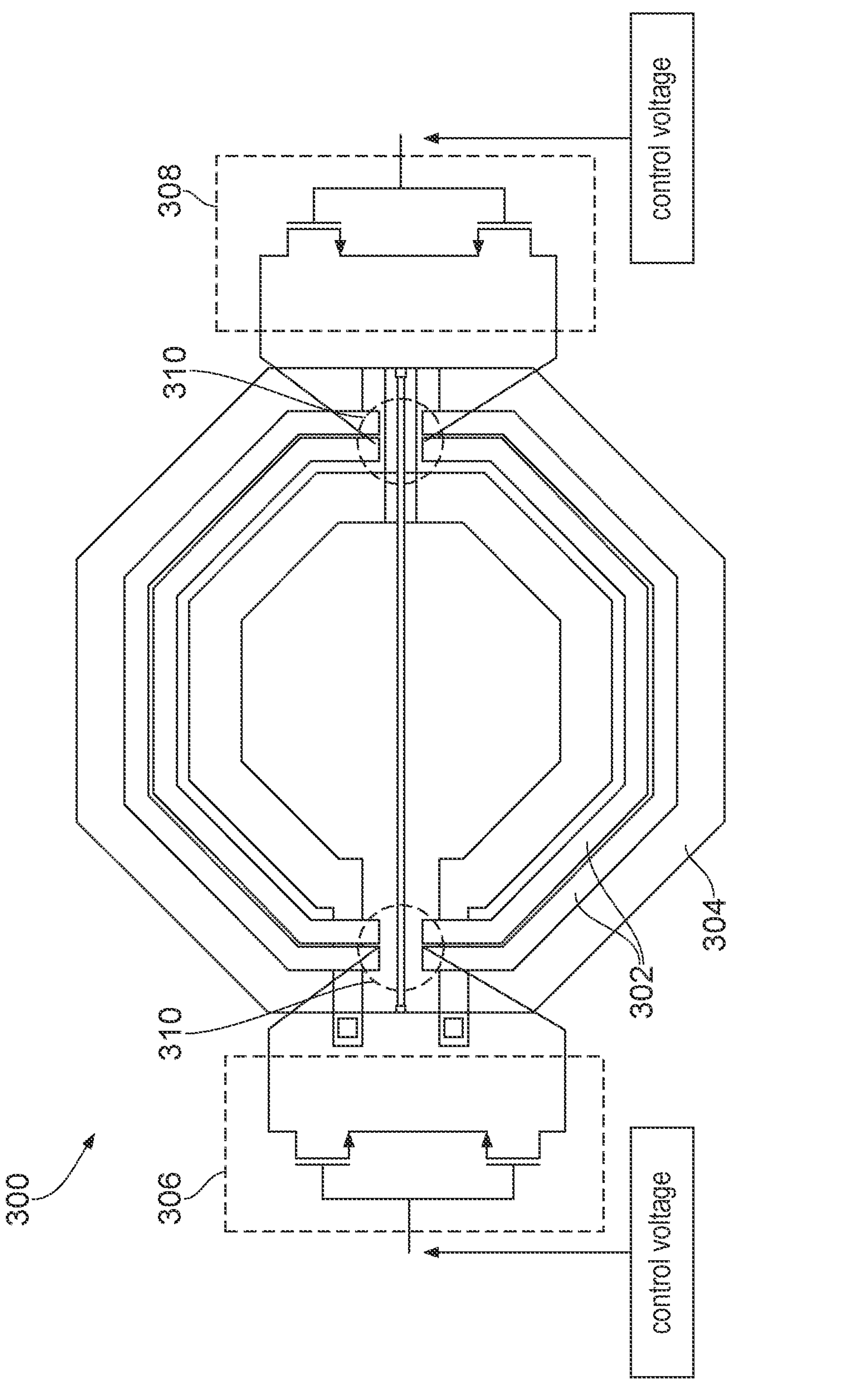
FIG. 3 shows an illustrative embodiment of an attenuator in a bottom view.

FIG. 3 shows an illustrative embodiment of an attenuator 300 in a bottom view. The attenuator 300 comprises a transformer arrangement as shown in a bottom view in FIG. 2B, having conductive loops 302 provided underneath transformer windings (not shown). Furthermore, the attenuator

300 comprises a shield 304 interposed between the transformer windings and the conductive loops 302. The conductive loops 302 comprise two apertures 310 for accommodating controllable elements 306, 308, such that a controller (not shown) is configured to control the amount of current flowing through the conductive loops 302 via the controllable elements 306, 308. In this practical implementation, the controllable elements 306, 308 are formed by MOS switches.

Figure 4A:
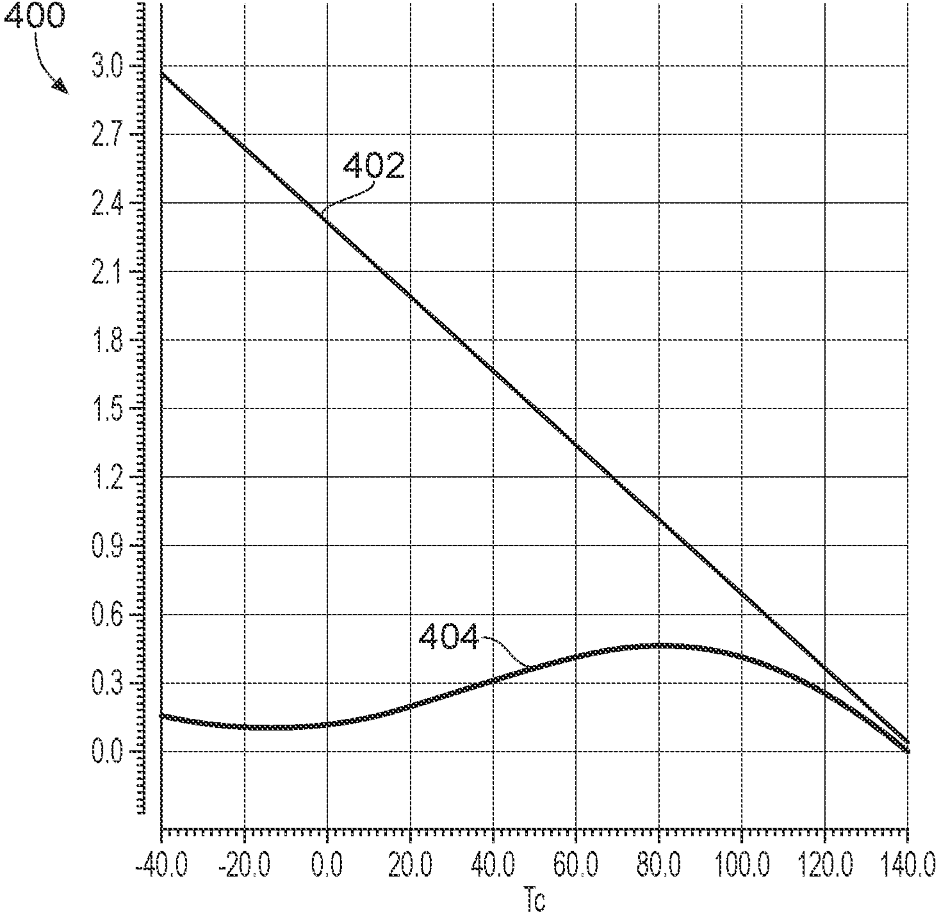
FIG. 4A shows a diagram of output power versus temperature.
Figure 4B:
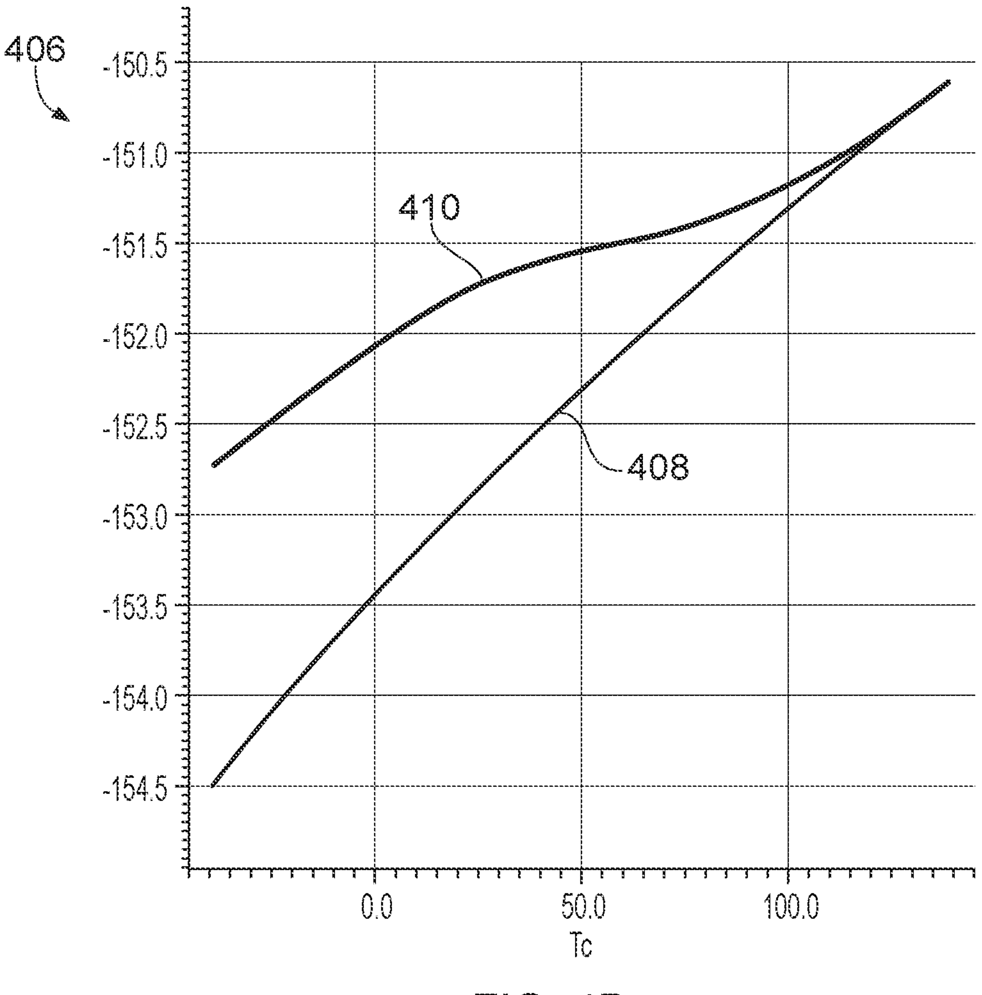
FIG. 4B shows a diagram of uncorrelated phase noise versus temperature.

FIGS. 4A and 4B show a diagram of output power versus temperature and a diagram of uncorrelated phase noise versus temperature, respectively. In particular, in FIG. 4A line 402 shows the output power versus temperature of an attenuator of the kind set forth, in which no compensation is applied (i.e., Vc=0). Furthermore, line 404 shows the output power versus temperature of an attenuator of the kind set forth, in which compensation is applied (i.e., Vc varies from 0.1V to 0.9V). It can be seen that the compensation results in an approximately flat output power over temperature. Furthermore, in FIG. 4B line 408 shows the uncorrelated phase noise versus temperature of an attenuator of the kind set forth, in which no compensation is applied. Furthermore, line 410 shows the uncorrelated phase noise versus temperature of an attenuator of the kind set forth, in which compensation is applied. It can be seen that the compensation results in no significant degradation of the uncorrelated phase noise. It is noted that FIGS. 4A and 4B illustrate an application for temperature compensation of the gain of an amplifier.

Figure 4C:
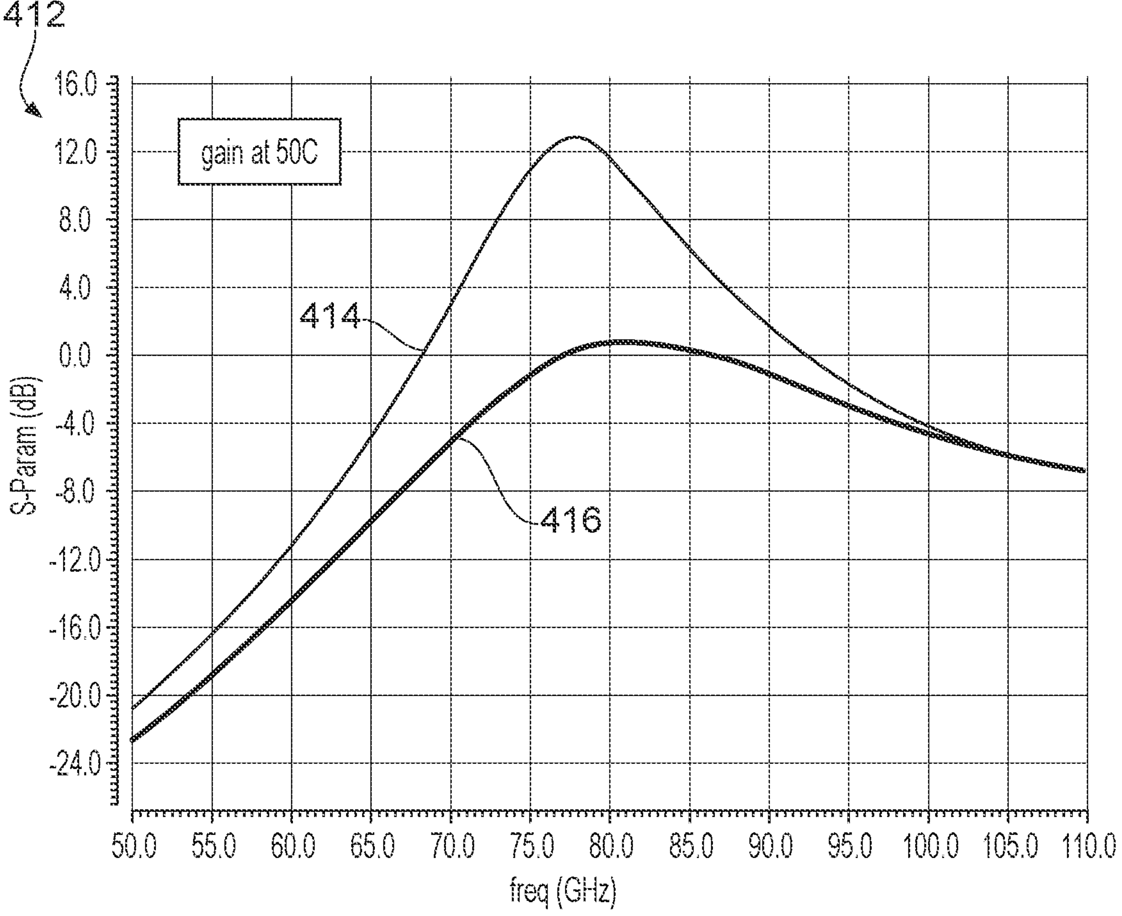
FIG. 4C shows a diagram of gain versus frequency at a temperature of 50 C.

FIG. 4C shows a diagram of gain versus frequency at a temperature of 50 C. In FIG. 4C line 414 shows the gain versus frequency at 50 C of an attenuator of the kind set forth, in which no compensation is applied, and line 416 shows the gain versus frequency at 50 C of the same attenuator in which compensation is applied. It is noted that FIG. 4C illustrates an application which is different from the temperature compensation of the gain of an amplifier. In this application, the aim is to achieve a high attenuation level regardless of the temperature, which means that the control does not depend anymore on the temperature, but on the targeted level of attenuation. Accordingly, FIG. 4C illustrates an application for level control/isolation.

It is noted that the embodiments above have been described with reference to different subject-matters. In particular, some embodiments may have been described with reference to method-type claims whereas other embodiments may have been described with reference to apparatus-type claims. However, a person skilled in the art will gather from the above that, unless otherwise indicated, in addition to any combination of features belonging to one type of subject-matter also any combination of features relating to different subject-matters, in particular a combination of features of the method-type claims and features of the apparatus-type claims, is considered to be disclosed with this document.

Furthermore, it is noted that the drawings are schematic. In different drawings, similar or identical elements are provided with the same reference signs. Furthermore, it is noted that in an effort to provide a concise description of the illustrative embodiments, implementation details which fall into the customary practice of the skilled person may not have been described. It should be appreciated that in the development of any such implementation, as in any engineering or design project, numerous implementation-specific decisions must be made in order to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill.

Finally, it is noted that the skilled person will be able to design many alternative embodiments without departing from the scope of the appended claims. In the claims, any reference sign placed between parentheses shall not be construed as limiting the claim. The word "comprise(s)" or "comprising" does not exclude the presence of elements or steps other than those listed in a claim. The word "a" or "an" preceding an element does not exclude the presence of a plurality of such elements. Measures recited in the claims may be implemented by means of hardware comprising several distinct elements and/or by means of a suitably programmed processor. In a device claim enumerating several means, several of these means may be embodied by one and the same item of hardware. The mere fact that certain measures are recited in mutually different dependent claims does not indicate that a combination of these measures cannot be used to advantage.

LIST OF REFERENCE SIGNS

100 amplifier
102 attenuator
104 Inductors
106 MOS transistors
108 MOS transistor
110 resistor
112 bypass capacitor
114 resistor
116 gain versus temperature
118 gain stage without the attenuator
120 gain stage with the attenuator
200 transformer arrangement (top view)
202 transformer windings
204 shield
206 transformer arrangement (bottom view)
208 conductive loops
210 apertures
300 attenuator (bottom view)
302 conductive loops
304 shield
306 MOS switch
308 MOS switch
310 apertures
400 output power versus temperature
402 output power without compensation
404 output power with compensation
406 uncorrelated phase noise versus temperature
408 uncorrelated phase noise without compensation
410 uncorrelated phase noise with compensation
412 gain versus frequency at 50 C
414 gain without compensation
416 gain with compensation

The invention claimed is:

1. A tunable attenuator, comprising:

one or more transformer windings configured to facilitate attenuating a signal;

one or more conductive loops provided underneath the transforming windings;

a controller configured to control an amount of current flowing through the conductive loops, thereby providing a tunable attenuation of said signal, wherein the conductive loops comprise one or more apertures for accommodating a controllable element.

2. The tunable attenuator of claim 1, further comprising a shield interposed between the transformer windings and the conductive loops.

3. A tunable attenuator, comprising:

one or more transformer windings configured to facilitate attenuating a signal;

one or more conductive loops provided underneath the transforming windings, wherein the conductive loops comprise one or more apertures for accommodating a controllable element; and a controller configured to control an amount of current flowing through the conductive loops, thereby providing a tunable attenuation of said signal, and wherein the controller is configured to control the amount of current flowing through the conductive loops via said controllable element.

4. The tunable attenuator of claim 3, wherein the controllable element is a controllable switch.

5. The tunable attenuator of claim 4, wherein the controllable switch is a metal oxide semiconductor, MOS, switch.

6. The tunable attenuator of claim 5, wherein the controller comprises a voltage control circuit which is operatively coupled to a gate of the MOS switch.

7. The tunable attenuator of claim 3, wherein the controller is configured to control the amount of current flowing through the conductive loops in dependence on a measured temperature.

8. An amplifier stage, in particular an amplifier stage for use in a radar transceiver, said amplifier stage comprising the tunable attenuator of claim 1.

9. A radar transceiver, in particular a millimeter-wave, mmw, radar transceiver, comprising the tunable attenuator of claim 1.

10. A method of producing a tunable attenuator, the method comprising providing the attenuator with:

one or more transformer windings configured to facilitate attenuating a signal;

one or more conductive loops provided underneath the transforming windings;

a controller configured to control an amount of current flowing through the conductive loops, thereby providing a tunable attenuation of said signal, wherein the controller is configured to control the amount of current flowing through the conductive loops in dependence on a measured temperature.

11. The method of claim 10, further comprising providing the attenuator with a shield interposed between the transformer windings and the conductive loops.

12. A method of producing a tunable attenuator, the method comprising providing the attenuator with:

one or more transformer windings configured to facilitate attenuating a signal;

one or more conductive loops provided underneath the transforming windings, wherein the conductive loops comprise one or more apertures for accommodating a controllable element;

a controller configured to control an amount of current flowing through the conductive loops, thereby providing a tunable attenuation of said signal, wherein the controller is configured to control the amount of current flowing through the conductive loops via said controllable element.

13. The method of claim 12, wherein the controllable element is a controllable switch.

14. The method of claim 13, wherein the controllable switch is a metal oxide semiconductor, MOS, switch.

15. The method of claim 14, further comprising providing the controller with a voltage control circuit which is operatively coupled to a gate of the MOS switch.

16. The method of claim 12, wherein the controller is configured to control the amount of current flowing through the conductive loops in dependence on a measured temperature.

17. The method of claim 12, further comprising integrating the tunable attenuator into an amplifier stage.

18. The method of claim 17, wherein the amplifier stage is an amplifier stage for use in a radar transceiver.

19. The method of claim 12, further comprising integrating the tunable attenuator into a radar transceiver.

20. The method of claim 19, wherein the radar transceiver is a millimeter-wave, mmw, radar transceiver.

* * * * *